US012718851B2

(12) United States Patent
Dastidar et al.

(10) Patent No.: US 12,718,851 B2
(45) Date of Patent: Aug. 25, 2026

(54) CONFIGURABLE INTERFACE CIRCUITRY

(71) Applicant: XILINX, INC., San Jose, CA (US)

(72) Inventors: Jaideep Dastidar, Austin, TX (US); David James Riddoch, Cambridgeshire (GB); Steven Leslie Pope, Cambridge (GB)

(73) Assignee: XILINX, INC., San Jose, CA (US)

( * ) Notice: Subject to any disclaimer, the term of this patent is extended or adjusted under 35 U.S.C. 154(b) by 200 days.

(21) Appl. No.: 18/109,229

(22) Filed: Feb. 13, 2023

(65) Prior Publication Data

US 2024/0274162 A1 Aug. 15, 2024

(51) Int. Cl.
*G11C 7/10* (2006.01)
*G06F 13/16* (2006.01)
*G11C 7/24* (2006.01)

(52) U.S. Cl.
CPC ........ *G11C 7/1039* (2013.01); *G06F 13/1673* (2013.01); *G11C 7/24* (2013.01)

(58) Field of Classification Search
CPC ..... G11C 7/1039; G11C 7/24; G06F 13/1673; G06F 15/163; G06F 15/17; G06F 15/825; G06F 15/82; G06F 15/7892; G06F 15/177; G06F 13/10; G06F 13/4004
See application file for complete search history.

(56) References Cited

U.S. PATENT DOCUMENTS 7,822,888 B2 * 10/2010 Saito .................. G06F 15/7867 711/138
9,411,613 B1 * 8/2016 McGarry ............. G06F 9/5072
10,311,627 B2 * 6/2019 Cho ........................ G06T 15/04
10,587,534 B2 * 3/2020 Gray ....................... H04L 12/18
10,673,439 B1 6/2020 Ahmad et al.
2004/0103265 A1 * 5/2004 Smith .................. G06F 15/177 712/15
2008/0288909 A1 * 11/2008 Leijten-Nowak ....... G06F 30/34 716/128

OTHER PUBLICATIONS

U.S. Appl. No. 17/892,949, filed Aug. 22, 2022 Entitled "Adaptive Integrated Programmable Data Processing Unit".

* cited by examiner

*Primary Examiner* — Idriss N Alrobaye
*Assistant Examiner* — Richard B Franklin
(74) *Attorney, Agent, or Firm* — Patterson + Sheridan, LLP

(57) ABSTRACT

An integrated circuit (IC) device includes functional circuits and multiple communication paths, which may include a first communication path through the functional circuits and a second communication path to permit the functional circuits to share information through a buffer and/or to bypass a subset of the functional circuits and a corresponding portion of the first communication path. The IC device may include a variety of protocol-specific interface circuits (ASIC and/or configurable circuitry) for respective IP blocks, and a controller that selectively directs traffic through the various communication paths. The controller may include a set of domain-specific OpCodes that link various subsets/combinations of the protocol-specific interface circuits as respective communication paths. The IC device may include multiple blocks of circuitry, each including a respective set of domain-specific circuitry (e.g., host-domain, network domain, RF domain, and/or data processing domain), and respective sets of OpCodes.

18 Claims, 8 Drawing Sheets

CONFIGURABLE INTERFACE CIRCUITRY

TECHNICAL FIELD

Examples of the present disclosure generally relate to a domain specific memory management.

BACKGROUND

In a system-on-a-chip (SoC), multiple circuit blocks may be combined with little or no appreciable attempt to consolidate and/or eliminate redundant and/or unnecessary features (e.g., memory, input/output buffering circuitry), optimize communication amongst the circuit blocks, address security/confidentiality of data transfers amongst the circuit blocks, or accommodate updates or changes to the circuit blocks. Such a SoC may utilize more area than necessary, consume more power than necessary, suffer from unnecessary loss of performance and/or latency, compromise security of user/tenant data, and/or become prematurely obsolete.

SUMMARY

Techniques for domain specific memory management are described.

One example is an integrated circuit (IC) device that includes a block of circuitry having a first set of functional circuits, memory circuitry, and interface circuitry that interfaces amongst the functional circuits and between a first buffer of the memory circuitry and the first set of functional circuits to permit the first set of functional circuits to share data with one another through the first buffer. The interface circuitry may provide a first communication path through the first set of functional circuits and a second communication path through the buffer that bypasses a subset of the functional circuits and a portion the first communication path.

Another example is an IC device that includes a block of circuitry having functional circuits, interface circuitry that provides multiple communication paths within the IC device, and a controller configured with parameters to control the block of integrated circuitry to use selectable subsets of the multiple paths to communicate amongst the set of functional circuits.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 3 is a block diagram of the IC device configured as a smart network interface controller (NIC), according to an embodiment.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
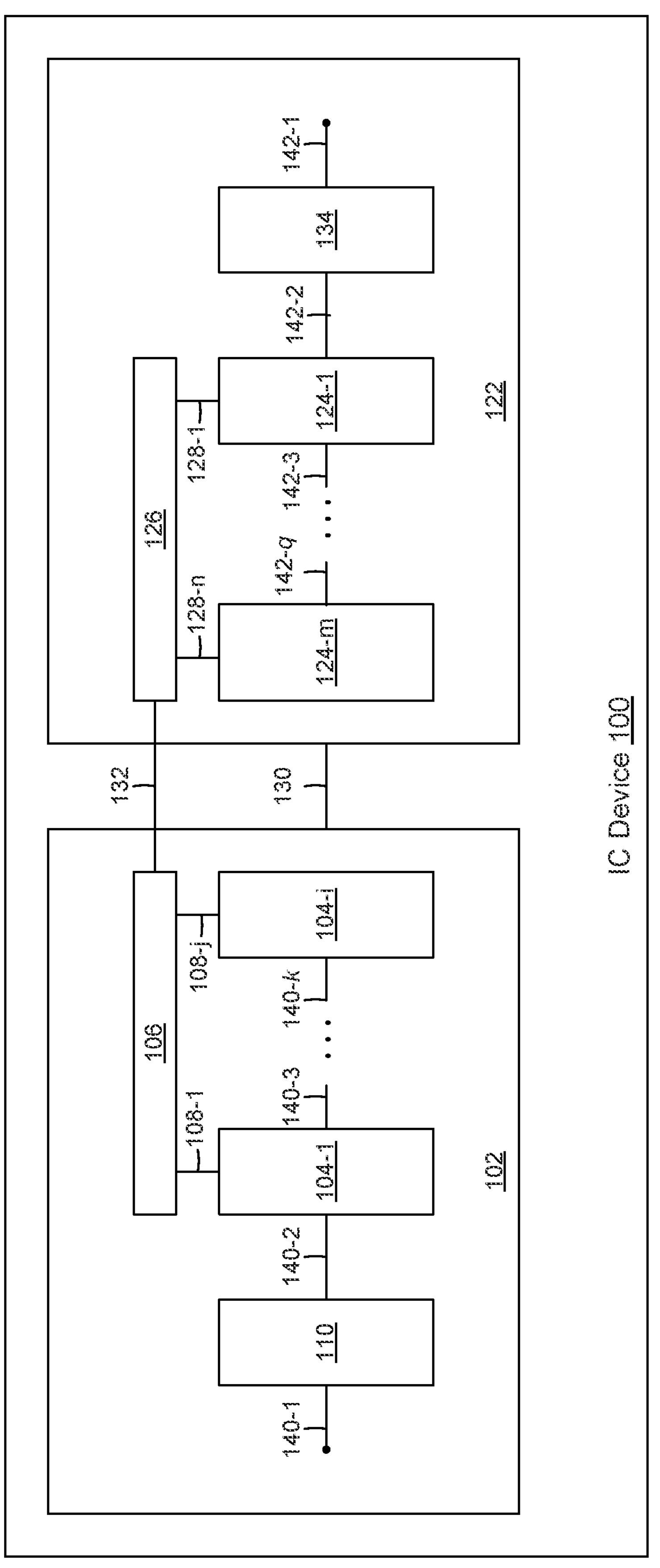
FIG. 1 is a block diagram of an integrated circuit (IC) device that includes multiple blocks of circuitry that include respective sets of functional circuits and respective buffers and related interface circuitry, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments described herein include an integrated circuit (IC) device that includes functional circuits and multiple communication paths, which may include a first communication path through the functional circuits and a second communication path to permit the functional circuits to share information through a buffer and/or to bypass a subset of the functional circuits and a corresponding portion of the first communication path. The IC device may include a variety of protocol-specific interface circuits (ASIC and/or configurable circuitry) for respective IP blocks, and a controller that selectively directs traffic through the various communication paths. The controller may include a set of domain-specific OpCodes that link various subsets/combinations of the protocol-specific interface circuits as respective communication paths. The IC device may include multiple blocks of circuitry, each including a respective set of domain-specific circuitry (e.g., host-domain, network domain, RF domain, and/or data processing domain), and respective sets of OpCodes.

FIG. 1 is a block diagram of an integrated circuit (IC) device 100, according to an embodiment. IC device 100 includes a block 102 of circuitry that includes circuits 104-1 through **104-*i* (collectively referred to as circuits 104). IC device 100 further includes a buffer 106 and interface circuitry 108-1 through 108-*j* (collectively referred to as interface circuitry 108) that interfaces between buffer 106 and circuits 104, or a subset thereof, to permit circuits 104 to share information with one another through buffer 106**.

In an embodiment, IC device 100 further includes a block 122 of circuitry that includes circuits 124-1 through **124-*m* (collectively referred to as circuits 124), a buffer 126, and interface circuitry 128-1 through 128-*n* (collectively referred to as interface circuitry 108). Interface circuitry 128 interfaces between buffer 126 and circuits 124, or a subset thereof, to permit circuits 124 to share information with one another through buffer 126. Circuits 124** may include respective hardware acceleration circuitry.

In the example of FIG. 1, block 102 further includes host interface circuitry 110 that interfaces between a host device and one or more of circuits 104, and block 122 includes network interface circuitry 134 that interfaces between a network device and one or more of circuits 124. Host interface circuitry 110 and network interface circuitry 134 may include respective physical layer (PHY) circuitry and media access controller (MAC) circuitry. Circuits 104 may perform host-related functions and circuits 124 may perform network-related functions. In this embodiment, IC device 100 may be referred to as a smart network interface controller (SmartNIC). As a SmartNIC, block 102 represents a host domain, in that circuits 104 perform host-related services, and block 122 represent a network domain, in that circuits 124 perform network-related services. IC device 100 is not, however, limited to network interface devices. Additional examples are provided further below.

IC device 100 further includes interface circuitry 140-1 through **140-*k* (collectively interface circuitry 140) that interface between respective ones of circuits 104 and host interface circuitry 110, and interface circuitry 142-1 through 142-*q* (collectively interface circuitry 142) that interface between respective ones of circuits 124 and network interface circuitry 134**.

IC device 100 further includes interface circuitry 130 that permits blocks 102 and 122 to communicate with one another, and interface circuitry 132 that permits circuits 104 and 124, or subsets thereof, to share data with one another through buffers 106 and 126.

Buffer 106 and interface circuitry 108 may be useful to permit circuits 104, or a subset thereof, to share information with one another independent of interface circuitry 140-3 through **140-*k*, which may conserve resources. Similarly, buffer 126 and interface circuitry 128 may be useful to permit circuits 124, or a subset thereof, to share information with one another independent of interface circuitry 142-3 through 142-*q*. Similarly, interface circuitry 132 may be useful to permit circuits 104 and 124, or subsets thereof, to share information with one another independent of interface circuitry 140-3 through 140-*k*, 142-3 through 142-*q*, and 130**.

Circuits 104 and 124 may be referred to as functional circuits (e.g., hardware acceleration circuits), which are distinguishable from interface circuitry. Circuits 104 and 124 may include ASIC-based circuitry. Circuits 104 and 124 may perform respective functions in a pipeline fashion, and interface circuitry 140-3 through **140-*k* and 142-3 through 142-*q*** may be referred to as pipeline interface circuitry.

Figure 2:
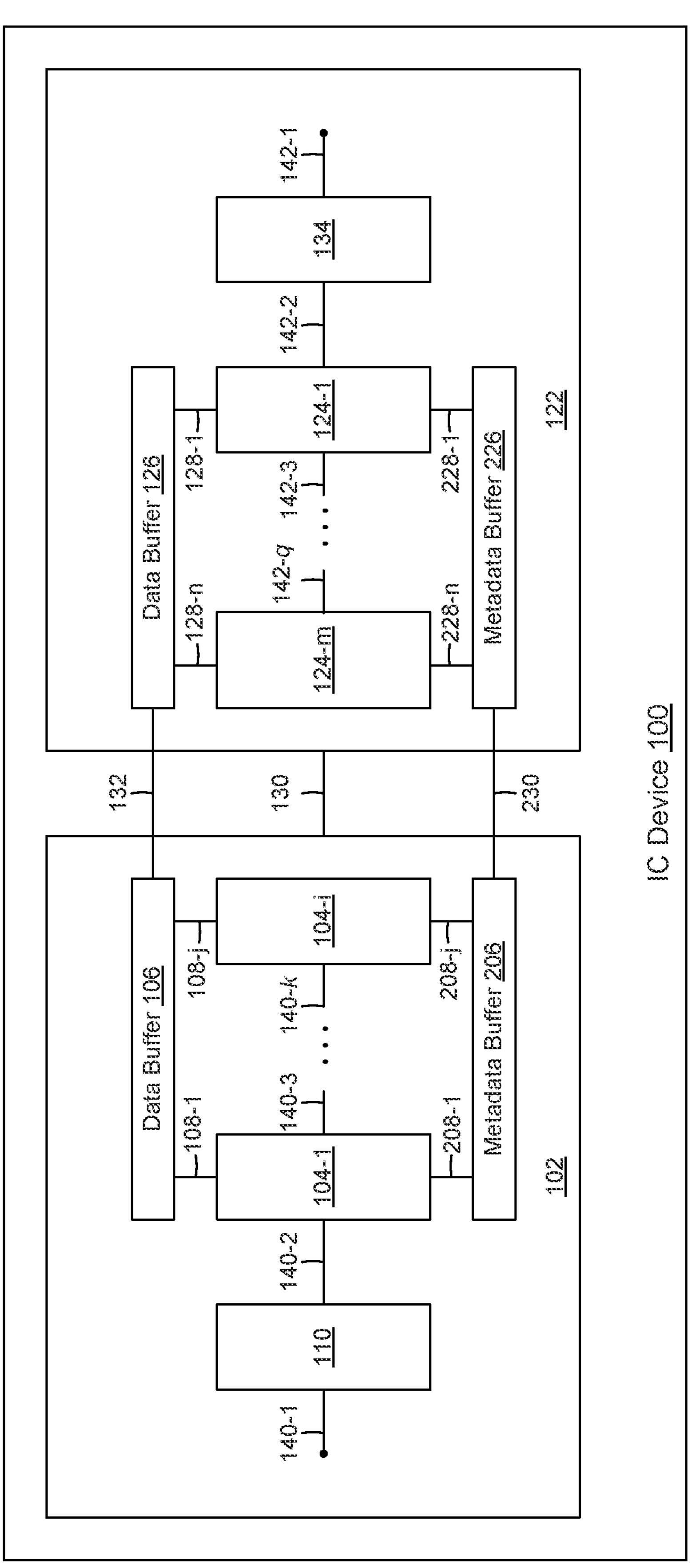
FIG. 2 is a block diagram of the IC device in which the buffers of FIG. 1 are illustrated as data buffers, and in which the blocks of circuitry further include respective metadata buffers and related interface circuitry, according to an embodiment.

FIG. 2 is a block diagram of IC device 100 in which buffers 106 and 126 are illustrated as data buffers, and in which IC device 100 further includes metadata buffers 206 and 226 and respective interface circuitry 208-1 through **208-*j* and 228-1 through 228-*n*, according to an embodiment. In this example, interface circuitry 108 permits circuits 104, or a subset thereof, to share data (e.g., packet data) with one another through data buffer 106, and interface circuitry 208 permits circuits 104, or a subset thereof, to share metadata (e.g., packet metadata) with one another through interface circuitry 208. Similarly, interface circuitry 128 permits circuits 124, or a subset thereof, to share data with one another through data buffer 126, and interface circuitry 228 permits circuits 124, or a subset thereof, to share metadata with one another through interface circuitry 228. IC device may further include interface circuitry 230 that permits circuits 104 and 124, or subsets thereof, to share metadata with one another through metadata buffers 206 and 226**.

Interface circuitry 108, 128, 130, 132, 140, 208, 228, and 230 may include application specific integrated circuitry (ASIC) (i.e., fixed-function/non-configurable circuitry), configurable circuitry (e.g., programmable logic), network-on-chip (NoC) circuitry, memory circuitry, and/or combinations thereof. PL-based interface circuitry, NoC-based interface circuitry, and/or memory-based interface circuitry may be useful to provide flexibility. ASIC-based interface circuitry may be useful to reduce power consumption, area consumption, and/or latency.

In an embodiment, IC device 100 includes multiple communication paths through block 102 and/or block 122, and may further include configurable control circuitry configured with operating parameters to utilize various subsets of the communication paths and associated communication protocols. The configurable control circuitry may, for example, include a first set of parameters to route information through via interface circuitry 140, 130, and 142, and a second set of parameters to route information to/from one or more of circuits 104 to/from one or more of circuits 124 via data buffers 106 and 126 and/or metadata buffers 206 and 226, effectively bypassing some of interface circuitry 140, 130, and 142, and possibly bypassing one or more of circuits 104 and 124. Additional examples are provided below.

Figure 3:
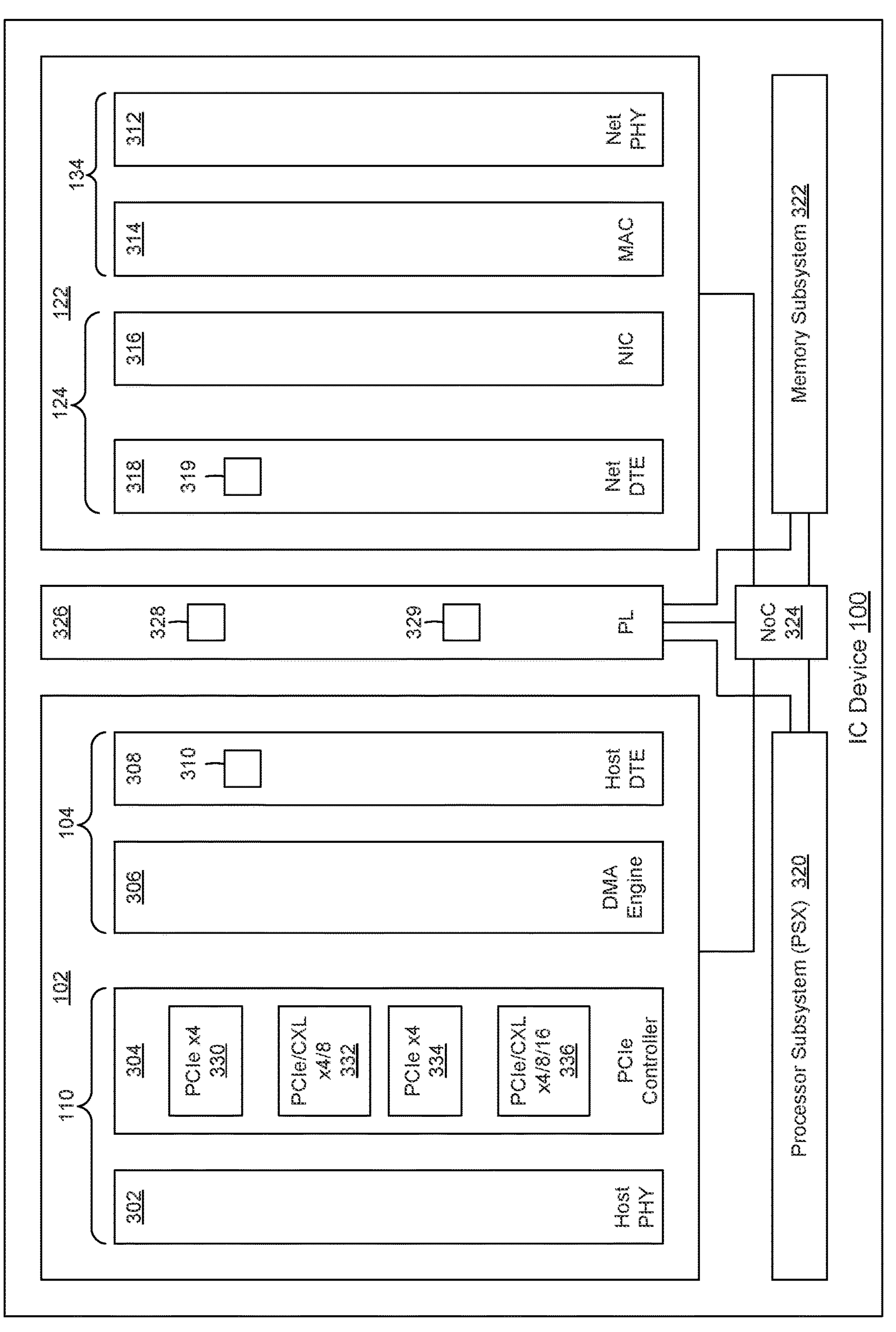
FIG. 3 is a block diagram of another embodiment of the IC device, according to an embodiment.

FIG. 3 is a block diagram of IC device 100, according to an embodiment. In the example of FIG. 3, host interface circuitry 110 includes host PHY circuitry 302 and peripheral component interface express (PCIe) controller circuitry 304. Host PHY circuitry 302 may include a multi-protocol PHY and PCIe controller circuitry 304 may include multiple PCIe controllers, illustrated here as PCIe controllers 330, 332, 334, and 336. PCIe controller circuitry 304 may serve as a MAC. Circuits 104 include a direct memory access (DMA) engine 306 and host data transform engine (DTE) 308. Network interface circuitry 134 includes network PHY circuitry 312 and MAC circuitry 314. Circuits 124 include network interface control (NIC) circuitry 316 and network DTE 318.

Host DTE 308 and network DTE 318 may include respective encryption circuitry 310 and 319, which may encrypt and/or decrypt based on a standard such as an advanced encryption standard (AES) developed by the National Institute of Standards and Technology (NIST) of the U.S. Department of Commerce. In an embodiment, encryption circuitry 310 employs an XTS mode of the AES standard developed by the IEEE Storage Working Group (SISWG), and encryption circuitry 319 employs a Galois/Counter mode (AES-GCM).

In FIG. 3, IC device 100 further includes a processor subsystem 320, a memory subsystem 322, network-on-chip (NoC) circuitry 324, and configurable circuitry, illustrated here as programmable logic (PL) 326. In the example of FIG. 3, buffers 106 and 126 of FIG. 1 may be provided within memory subsystem 322, or may be omitted. Additional functional circuitry 329 (e.g., pipeline acceleration circuitry) may be configured within PL circuitry 326.

In FIG. 3, IC device 100 may include interface circuitry that provides multiple communication paths throughout IC device 100, examples of which are provided further below with reference to FIGS. 4-6 (a fuller set of interface circuitry may be too extensive to illustrate in a single drawing figure). In an embodiment, the interface circuitry includes ASIC-based interface circuitry, and may further include PL-based interface circuitry configured within PL circuitry 326. In an embodiment, all or substantially all interface circuitry is provided as ASIC. In another embodiment, a portion of the interface circuitry is provide as ASIC and remaining portions of the interface circuitry is configured with PL circuitry 326. NoC circuitry 324 and/or memory subsystem 322 may also be used to interface amongst functional circuitry of IC device 100. As described further above, PL-based interface circuitry, NoC-based interface circuitry, and/or memory-based interface circuitry may be useful to provide flexibility. ASIC-based interface circuitry may be useful to reduce power consumption, area consumption, and/or latency.

In FIG. 3, IC device 100 further includes control circuitry 328 that enables various subsets of the communication paths and associated communication protocols. Control circuitry 328 may be configurable with multiple sets of domain-specific operating parameters, or operation code (OpCode) to utilize respective subsets of the communication paths, desired sequences, and associated communication protocols. Control circuitry 328 may apply one or more OpCodes at any given time and/or may switch amongst OpCodes. Choices of OpCodes, along with sequences and timing of the OpCodes, may be based on one or more factors such as types of data being processed (e.g., emails, video, and/or images), metadata (e.g., host source, network destination, network IP address, allocated user frequency (e.g., for an RF domain described further below with reference to FIG. 7), selectable modes of operation, and/or other criteria. The factors may include domain-specific factors. In the example of FIG. 3, domain-specific factors may include host domain-specific factors and/or network domain-specific factors.

Control circuitry 328 is illustrated within programmable logic 326. Alternatively or additionally, control circuitry 328 may be implemented in ASIC, processor subsystem 320, an embedded controller, firmware, or combinations thereof.

Figure 4:
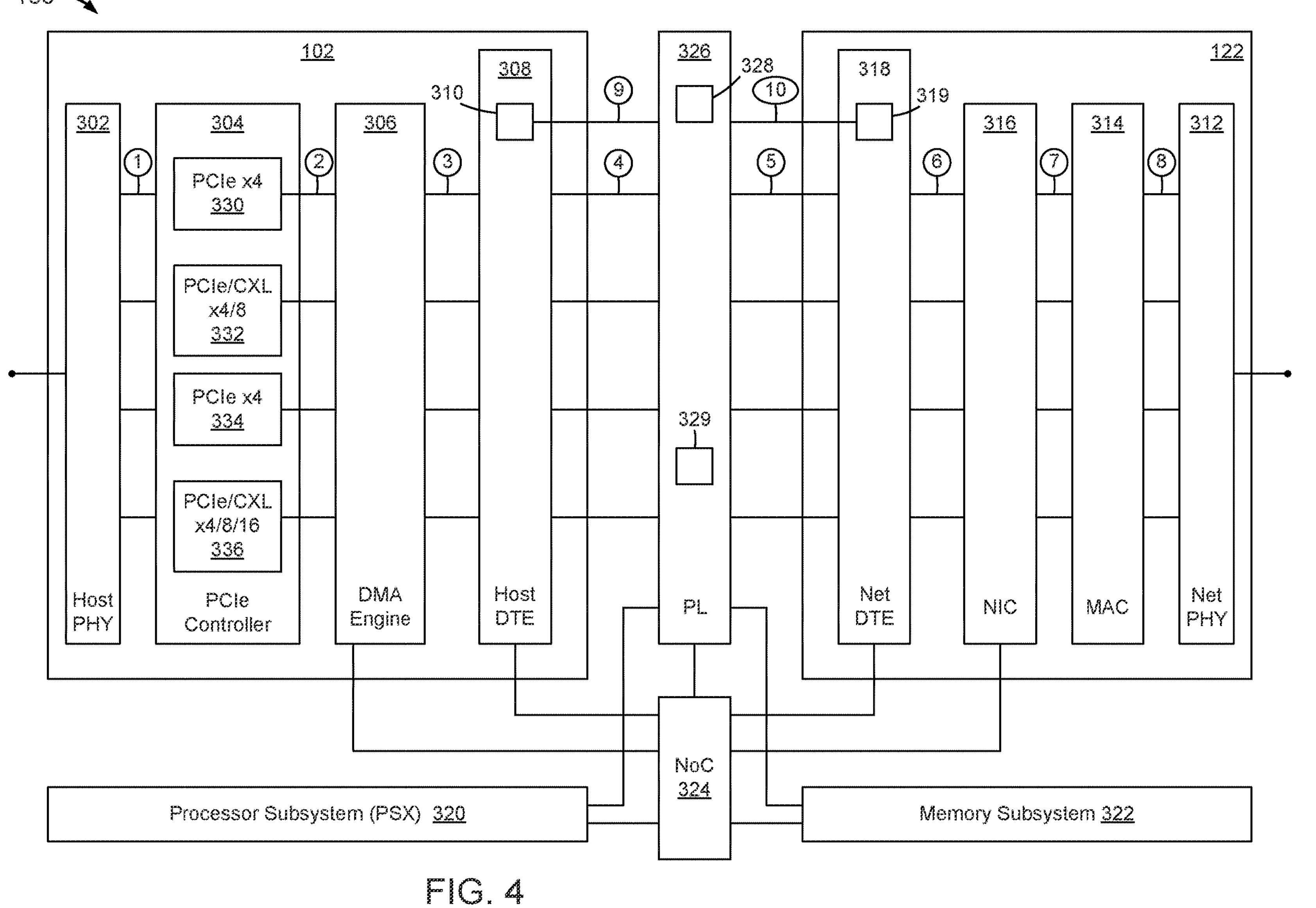
FIG. 4 is a block diagram of the IC device as illustrated in FIG. 3, further including example interface circuitry, according to an embodiment.

FIG. 4 is a block diagram of IC device 100, as illustrated in FIG. 3, further including example interface circuitry, according to an embodiment. In FIG. 4, the example interface circuitry is illustrated as lines connecting various circuit blocks. In an embodiment, lines going through PL circuitry 326 represent configurable/programmable logic within PL circuitry 326, and remaining lines represent ASIC, IC device 100 is not, however, limited to this example. The interface circuitry may represent respective protocol-specific interface circuitry (i.e., interface circuitry that is specific to the respective functional circuits). Protocol-specific interface circuitry may also be referred to as intellectual property (IP) specific interface circuitry.

In the example of FIG. 4, control circuitry 328 may include an OpCode that specifies interface circuitry 1 through 8 as a sequential set of paths through IC device 100 for PCIe controller 330. Alternatively, or additionally, control circuitry 328 may include an OpCode that specifies interface circuitry 1 through 4 as a sequential set of paths through block 102, and an OpCode that specifies interface circuitry 5 through 8 as a sequential set of paths through block 122. Control circuitry 328 may include one or more additional OpCodes that include interface circuitry 9 and/or interface circuitry 10 (i.e., through PL circuitry 326) to encrypt and/or decrypt data. IC device 100 may include similar interface circuitry for other PCIe controllers.

Figure 5:
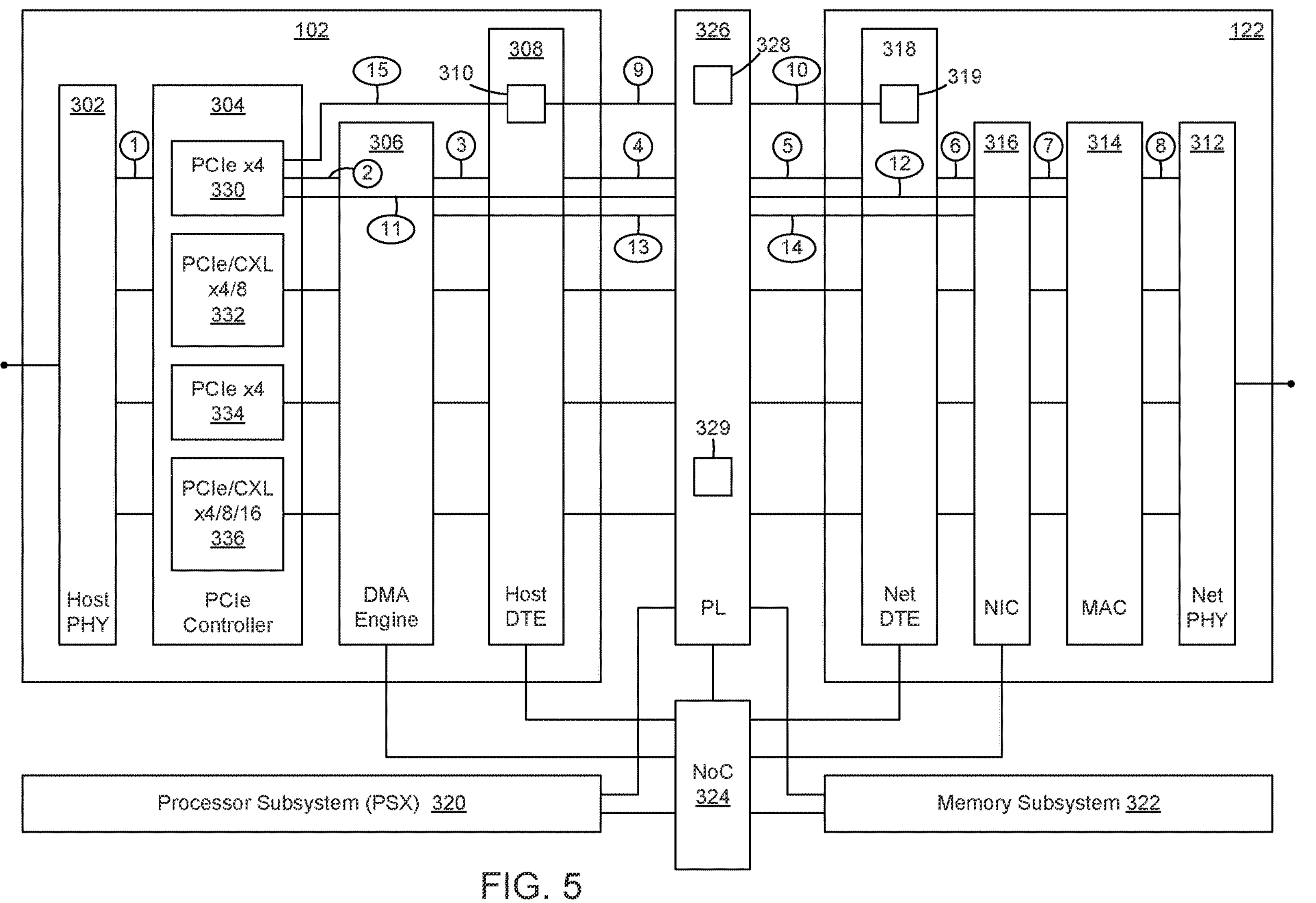
FIG. 5 is a block diagram of IC device 100, as illustrated in FIG. 4, including additional example interface circuitry, according to an embodiment.

FIG. 5 is a block diagram of IC device 100, as illustrated in FIG. 4, including additional example interface circuitry, designated 11 through 15, according to an embodiment. Interface circuitry 11 through 15 may represent respective protocol-specific interface circuitry, according to an embodiment.

In the example of FIG. 5, control circuitry 328 may further include an OpCode that specifies interface circuitry 1, 11, 12, and 8 as a sequential set of paths through IC device 100 for PCIe controller 330 (e.g., bypassing DMA engine 306, host DTE 308, network DTE 318, NIC 316, and associated interface circuitry). Alternatively, or additionally, control circuitry 328 may include an OpCode that specifies interface circuitry 1 and 11 as a path through block 102, and an OpCode that specifies interface circuitry 12 and 8 as a path through block 122.

Control circuitry 328 may further include an OpCode that specifies interface circuitry 1, 2, 13, 14, 7, and 8 as a sequential set of paths through IC device 100 for PCIe controller 330 (e.g., bypassing host DTE 308, network DTE 318, and associated interface circuitry). Alternatively, or additionally, control circuitry 328 may include an OpCode that specifies interface circuitry 1, 2, and 13 as a path through block 102, and an OpCode that specifies interface circuitry 14, 7, and 8 as a path through block 122.

Control circuitry 328 may further include an OpCode that specifies interface circuitry 1 and 15 as a sequential set of paths for PCIe controller 330 to provide data to encryption circuitry 310 (e.g., bypassing DMA engine 306, host DTE 308, and associated interface circuitry including PL circuitry 326). The OpCode may specific additional interface circuitry, such as to provide results of encryption circuitry 310 to block 122 and/or to memory subsystem 322.

Control circuitry 328 may further include an OpCode that provides data to encryption circuitry 319, bypassing encryption circuitry 310, or vice versa.

Control circuitry 328 may further include one or more OpCodes to move data to and/or from memory subsystem 322, such as described above with respect to FIG. 1 and/or FIG. 2. Control circuitry 328 may further include one or more OpCodes to move data to and/or from processor subsystem 320. Control circuitry 328 may further include one or more OpCodes to move data via NoC circuitry 324.

Figure 6:
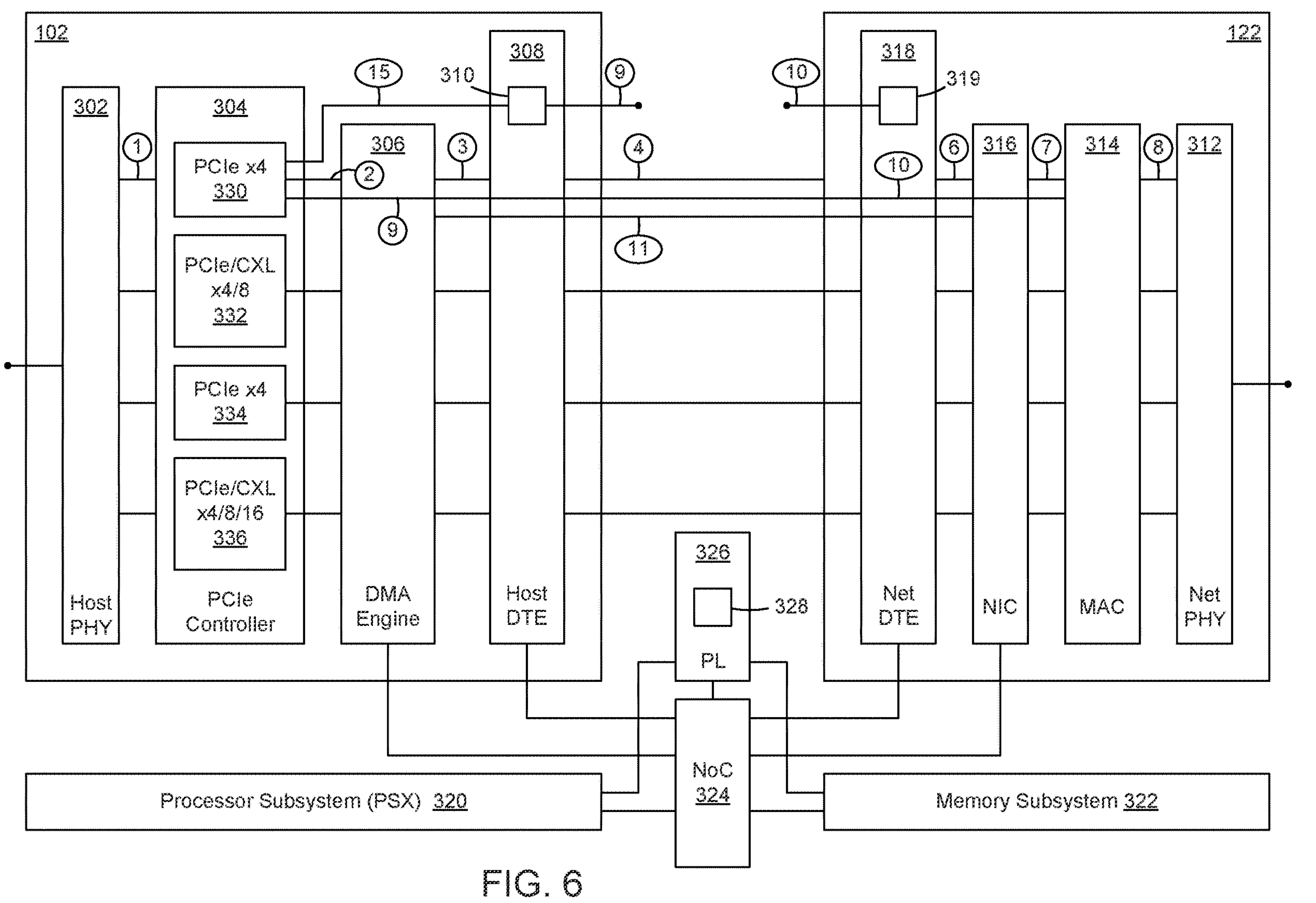
FIG. 6 is a block diagram of the IC device as illustrated in FIG. 5, in which interface circuitry is provided in application specific integrated circuitry rather than configurable circuitry of FIG. 5, according to an embodiment.

FIG. 6 is a block diagram of IC device 100, as illustrated in FIG. 5, in which interface circuitry between blocks 102 and 122 are provided in ASIC (i.e., bypassing PL circuitry 326), according to an embodiment. In this example, interface circuitry 9 and 10 may include ASIC, NoC circuitry 324, memory subsystem 322, or combinations thereof.

In the foregoing examples, block 102 is configured as a packet-based host-domain block and block 122 is configured as a packet-based network-domain block. Methods and systems disclosed herein are not, however, limited to the foregoing examples. Additional examples are provided below.

Figure 7:
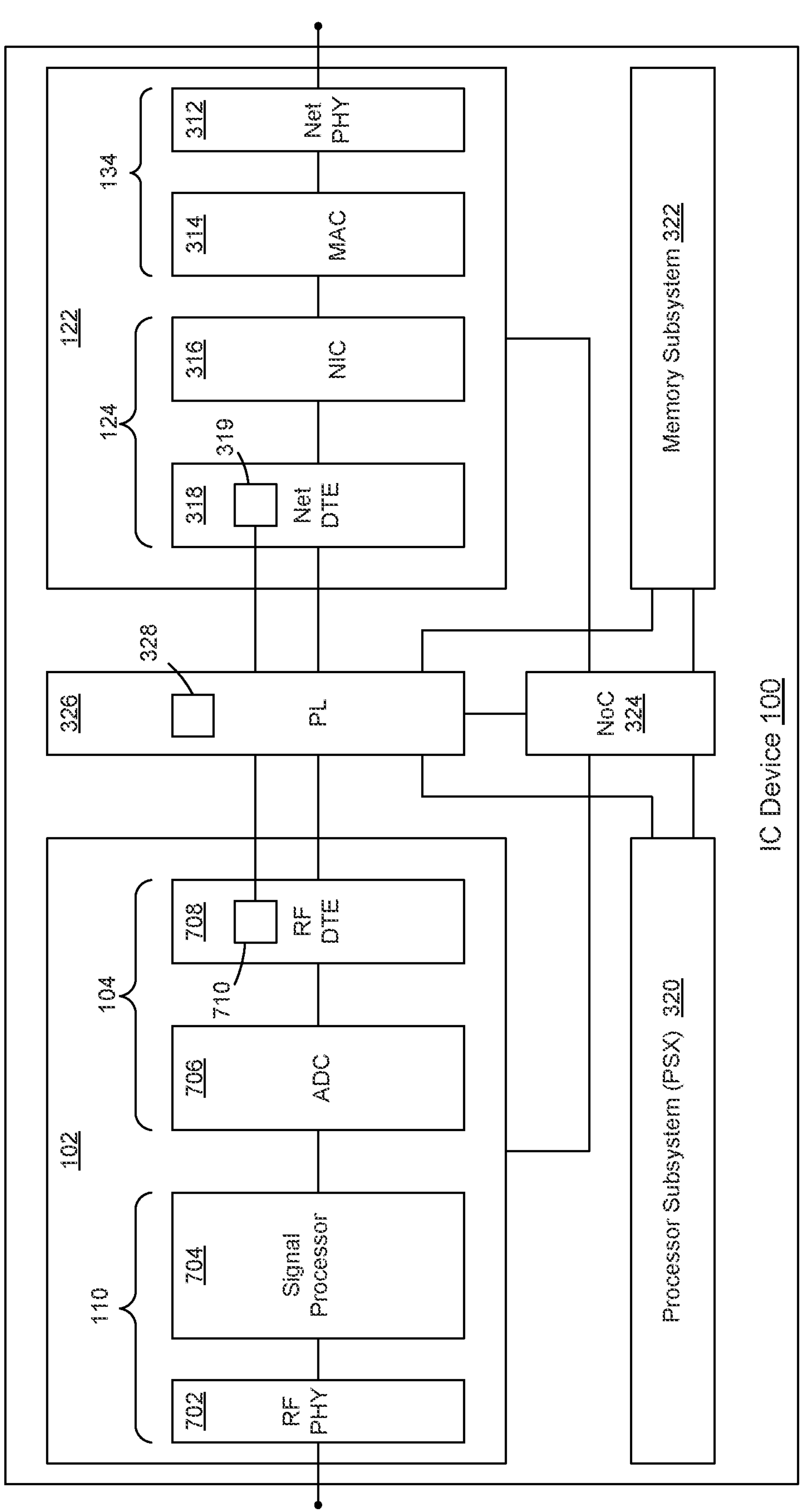
FIG. 7 is a block diagram of the IC device, based on the example of FIG. 3, configured as a radio frequency (RF) receiver (e.g., a wireless base station), according to an embodiment.

FIG. 7 is a block diagram of IC device 100, based on the example of FIG. 3, in which block 102 is configured as a radio frequency (RF) receiver, according to an embodiment. In this example, IC device 100 may represent a wireless base station. In FIG. 7, host interface circuitry 110 includes RF PHY circuitry 702 and a signal processor 704, and circuits 104 include analog-to-digital converter (ADC) circuitry 706 and an RF DTE 708. Block 122 may be configured as a network interface controller, such as described in one or more examples above. RF DTE 708 and network DTE 318 may include respective encryption circuitry 710 and 319. In an embodiment. RF PHY circuitry 702 receives a signal at a multiple-in-multiple-out (MIMO) rate, signal processor 704 demodulates data from the received signal, ADC circuitry 706 converts the demodulated data to digital data, RF DTE 708 decrypts the digital data, and network DTE 318 encrypts the data for network wireline transmission.

In FIG. 7, IC device 100 may include interface circuitry that provides multiple communication paths throughout IC device 100, and may further include control circuitry 328, configured with RF domain-specific OpCodes to enables various subsets of the communication paths and associated communication protocols, such as described in one or more examples above.

Figure 8:
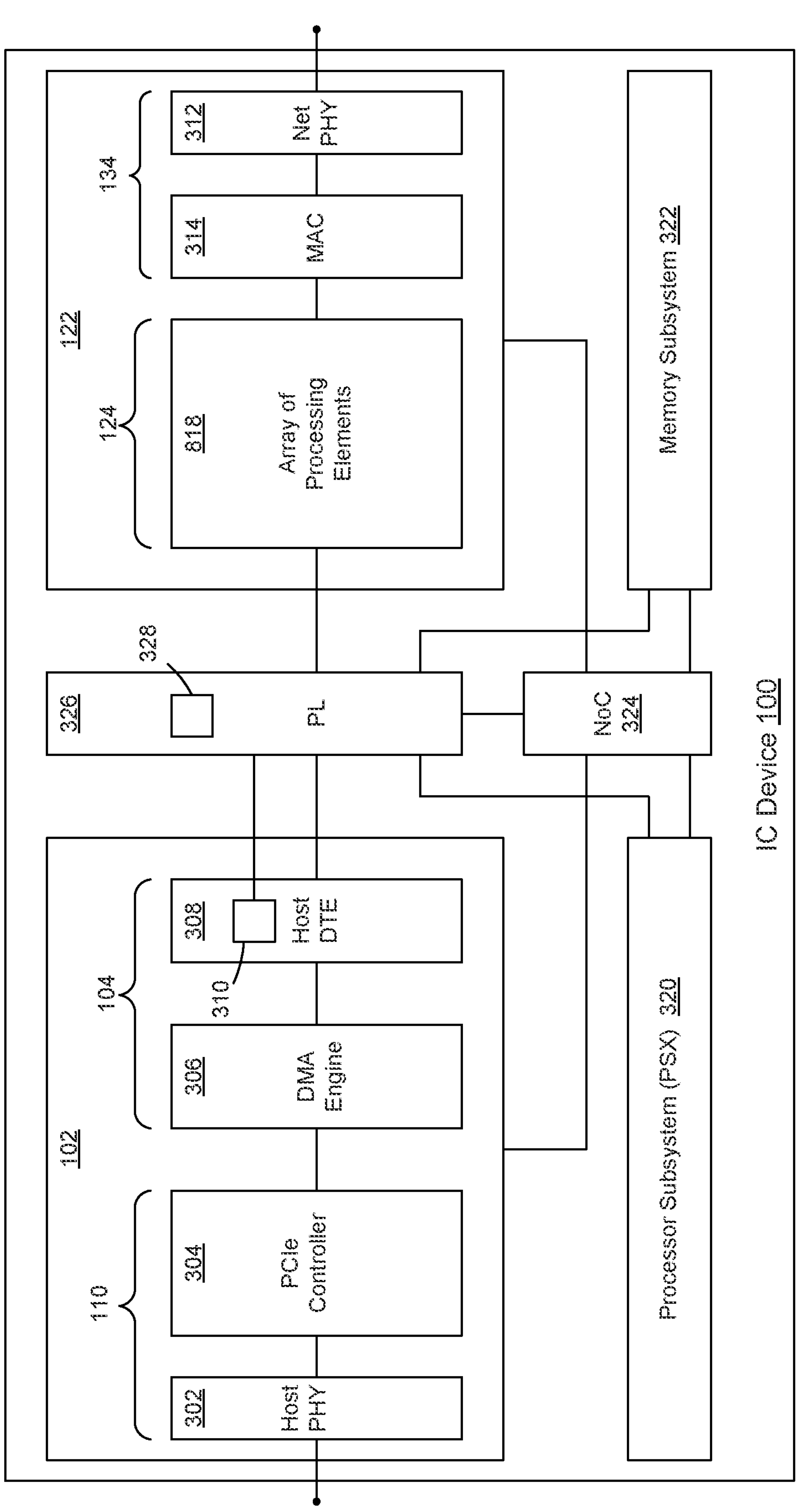
FIG. 8 is a block diagram of the IC device, based on the example of FIG. 3, including pipelined acceleration circuits that process data in a predetermined sequence, illustrated here as including an array of data processing engines, according to an embodiment.

FIG. 8 is a block diagram of IC device 100, based on the example of FIG. 3, in which circuits 124 include pipelined acceleration circuits that process data in a predetermined sequence, illustrated here as including an array 818 of data processing engines. Array 818 may include, for example, an array of artificial intelligence processing elements. In this example, IC device 100 may represent a data processing domain, which may communicate with a network storage device through network interface circuitry 134.

In FIG. 8, IC device 100 may include interface circuitry that provides multiple communication paths throughout IC device 100, including interface circuitry to individual processing elements of array 818. In this example, control circuitry 328 may be configured with data processing domain-specific OpCodes to enable various subsets of the communication paths and associated communication protocols, such as described in one or more examples above, and may further include OpCodes to directly access the individual processing elements of array 818.

In an embodiment, elements of FIGS. 7 and 8 may be combined to perform AI inference of wireless data.

IC device 100 may represent a system-on-chip (SoC). IC device 100 may be fabricated as a domain-specific adaptive SoC and configured with domain-specific overlays (i.e., OpCodes) that combine various protocol-specific interface configurations. The domain-specific overlays may include a set of domain-specific opcodes for each of multiple domains (e.g., ethernet, security, network firewall, data processing, and/or RF). Domain-specific overlays may be provided in configurable circuitry (e.g., PL circuitry 326), and/or as instructions stored in memory subsystem 322 and/or/firmware for execution by processor subsystem 320 and/or an embedded controller, to permit reconfiguration for different domains, customers, and/or applications. Multiple domain-specific overlays may developed for a given design of IC device 100, which may be useful where a user utilizes the design in multiple applications (e.g., cloud-based and edge-based), and/or to accommodate needs of multiple users.

OpCodes, as described herein, essentially inform functional circuitry what tasks to perform, and a sequence in which to perform the tasks (i.e., domain-specific sequencing), at a high level. Based on the OpCodes, the functional circuitry may perform numerous and/or complex functions. The OpCodes may be roughly analogous to reduced instruction set computer (RISC) commands that cause the functional circuitry to implement complex instruction set computer (CISC) commands. Alternatively, the OpCodes may be roughly analogous to macro commands or macro OpCodes that cause the functional circuitry to perform relatively complex micro commands or micro OpCodes. The OpCodes may also be roughly analogous to application programming interfaces (APIs).

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product.

Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit (IC) device, comprising:

a first block of circuitry comprising a first set of functional circuits;

a second block of circuitry comprising a second set of functional circuits;

memory circuitry; and interface circuitry configured to:

interface amongst the first set of functional circuits and between a first buffer of the memory circuitry and the first set of functional circuits to permit the first set of functional circuits to share data with one another through the first buffer;

interface between a second buffer of the memory circuitry and the second set of functional circuits to permit the second set of functional circuits to share data with one another through the second buffer;

interface between the first and second buffers to permit the first and second sets of functional circuits to share data with another through the first and second buffers; and interface directly between the first and second sets of functional circuits.

2. The IC device of claim 1, wherein the interface circuitry is further configured to provide a first communication path through the first set of functional circuits and a second communication path through the first buffer, wherein the second communication path bypasses a subset of the functional circuits of the first set of functional circuits and a portion the first communication path.

3. The IC device of claim 1, wherein:

the first set of functional circuits comprise a first set of hardware acceleration circuits and host interface circuitry configured to interface between an external host device and the first set of hardware acceleration circuits, wherein the first set of hardware acceleration circuits are configured to perform host-related functions; and the second set of functional circuits comprise a second set of hardware acceleration circuits and network interface circuitry configured to interface between an external network device and the second set of hardware acceleration circuits, wherein the second set of hardware acceleration circuits are configured to perform network-related functions.

4. The IC device of claim 3, wherein the first buffer comprises a first data buffer and a first metadata buffer, wherein the second buffer comprises a second data buffer and a second metadata buffer, and wherein the interface circuitry is further configured to:

permit the first set of hardware acceleration circuits to share data with one another through the first data buffer;

permit the first set of hardware acceleration circuits to share metadata with one another through the first metadata buffer;

permit the second set of hardware acceleration circuits to share data with one another through the second data buffer;

permit the second set of hardware acceleration circuits to share metadata with one another through the second data buffer;

permit the first and second sets of hardware acceleration circuits to share data with one another through the first and second data buffers; and permit the first and second sets of hardware acceleration circuits to share metadata with one another through the first and second metadata buffers.

5. The IC device of claim 1, wherein the first block of circuitry is implemented in application specific integrated circuitry (ASIC), wherein the interface circuitry is implemented at least partially in ASIC, wherein the interface circuitry includes multiple communication paths within the IC device, and wherein the IC device further comprises:

configurable control circuitry configured with parameters to control the first block of integrated circuitry to use a selectable subset of the multiple communication paths.

6. An integrated circuit (IC) device, comprising:

a first circuit block comprising a first set of functional circuits that comprise first hardware acceleration circuitry and first interface circuitry configured to interface between a first domain-specific external device and the first hardware acceleration circuitry, and to perform functions related to the first domain-specific external device;

a second circuit block comprising a second set of functional circuits that comprise second hardware acceleration circuitry and second interface circuitry configured to interface between a second domain-specific external device and the second hardware acceleration circuitry, wherein the second hardware acceleration circuitry is configured to perform functions related to the second domain-specific external device;

multiple links and interface circuits amongst the first and second circuit blocks; and control circuitry configured to issue control words that specify subsets of one or more of the links and the interface circuits for communications amongst the first and second circuit blocks based on one or more of data types and metadata, and to control the second circuit block to use selectable subsets of the links to communicate amongst the second set of functional circuits and to communicate between the first and second circuit blocks, based on the control words.

7. The IC device of claim 6, wherein the first circuit block is configured to utilize a respective one of the subsets of the links and associated communication protocols based on the control words.

8. The IC device of claim 6, wherein the control circuitry comprises configurable circuitry.

9. The IC device of claim 6, further comprising:

memory circuitry comprising the control words;

wherein the control circuitry comprises an instruction processor configured to access the control words from the memory circuitry.

10. The IC device of claim 9, wherein:

the memory comprises firmware-based memory; and the processor comprises an embedded instruction processor.

11. The IC device of claim 6, wherein the interface circuits comprise one or more of:

memory circuitry and interface circuitry configured to permit the first and second circuit blocks to share data with one another through the memory circuitry;

network-on-chip circuitry configured to permit the first and second circuit blocks to share data with one another over a packet-switched network; and a protocol-specific integrated circuit.

12. The IC device of claim 6, wherein:

the control circuitry is further configured to control the first set of functional circuits to process data in a pipeline fashion based on a first set of the control words, and to bypass one or more of the hardware acceleration circuits and associated interface circuitry based on a second set of the control words.

13. The IC device of claim 12, wherein the first circuit block further comprises one or more of:

host interface circuitry configured to communicate between the first domain-specific external device and the hardware acceleration circuits; and network interface circuitry configured to communicate between the first domain-specific external device and the first hardware acceleration circuitry.

14. The IC device of claim 6, wherein:

the first interface circuitry comprises host interface circuitry configured to interface with an external host device; and the second interface circuitry comprises network interface circuitry configured to interface with an external network device.

15. The IC device of claim 6, wherein:

the first interface circuitry comprises radio frequency (RF) interface circuitry configured to interface with an RF receiver; and the second interface circuitry comprises network interface circuitry configured to interface with an external network device.

16. The IC device of claim 6, wherein:

the first interface circuitry comprises host interface circuitry configured to interface with the first domain-specific external device;

the second interface circuitry comprises network interface circuitry configured to interface with an external network device; and the second set of functional circuits further comprise an array of processing elements.

17. The IC device of claim 6, wherein:

the IC device is configurable for multiple domain applications;

the control words comprise multiple sets of respective domain-specific control words; and the control circuitry is further configured to use a selectable set of the domain-specific control words based on the domain application for of the IC device is configured.

18. The IC device of claim 6, wherein the control words further specify sequences of the specified subsets of one or more of the links and the specified interface circuits for the communications amongst the first and second circuit blocks.

* * * * *